United States Patent
Wang et al.

(10) Patent No.: US 6,893,909 B2
(45) Date of Patent: May 17, 2005

(54) METHOD OF MANUFACTURING METAL-OXIDE-SEMICONDUCTOR TRANSISTOR

(75) Inventors: Yu-Ren Wang, Tainan (TW); Chun-Yi Lee, Hsinchu (TW); Yu-Kun Chen, Hsinchu (TW); Neng-Hui Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/681,768

(22) Filed: Oct. 7, 2003

(65) Prior Publication Data

US 2005/0074931 A1 Apr. 7, 2005

(51) Int. Cl.[7] .............................................. H01L 21/00
(52) U.S. Cl. ........................ 438/166; 438/481; 438/482
(58) Field of Search ................................ 438/166, 481, 438/482, 486, 226, 229

(56) References Cited

U.S. PATENT DOCUMENTS 6,806,149 B2 * 10/2004 Bu et al. .................... 438/299

2003/0162336 A1 * 8/2003 Wei et al. ................... 438/166
2004/0121565 A1 * 6/2004 Wieczorek et al. ......... 438/481

* cited by examiner

Primary Examiner—Thao P. Le
(74) Attorney, Agent, or Firm—J.C. Patents

(57) ABSTRACT

A method of manufacturing a MOS transistor is provided. A gate insulation layer and a conductive layer are sequentially formed over a substrate. A pre-amorphization implantation is carried out to amorphize the conductive layer. The conductive layer and the gate insulation layer are patterned to form a gate structure. A first spacer is formed on the sidewall of the gate structure. A second pre-amorphization implantation is carried out to amorphize a portion of the substrate. A doped source/drain extension region is formed in the substrate on each side of the first spacer. A second spacer is formed on the sidewall of the first spacer and then a doped source/drain region is formed in the substrate on each side of the second spacer. A solid phase epitaxial process is carried out to convert the doped source/drain extension region and the doped source/drain region into a source/drain terminal. In the pre-amorphization implantations, dopants having an ionic radius greater than the germanium ion are used.

18 Claims, 4 Drawing Sheets

METHOD OF MANUFACTURING METAL-OXIDE-SEMICONDUCTOR TRANSISTOR

BACKGROUND OF THE INVENTION

1. Field of the Invention

The present invention relates to a method of manufacturing a semiconductor device. More particularly, the present invention relates to a method of manufacturing a metal-oxide-semiconductor (MOS) transistor.

2. Description of the Related Art

As the level of integration in integrated circuits continues to increase, area occupation of each semiconductor device is reduced. Consequently, the specification in circuit design must be changed to reflect such reduction. At present, integrated circuits are designed to have feature dimension in the deep sub-micron range. However, as the integrated circuit device such as a deep sub-micron metal-oxide-semiconductor (MOS) device is miniaturized, depth of the source/drain terminal within a substrate must be reduced in a corresponding way. Yet, the reduction of the junction depth of the source/drain terminal must not result in any increase in resistance. In fact, the capacity to produce a source/drain terminal with all the desired specifications is a major factor that determines the ultimate quality of a MOS transistor.

The conventional method of fabricating a MOS transistor involves the following steps. First, a pre-amorphization implantation is carried out on a substrate having a gate structure thereon. Thereafter, an extension region and doped source/drain region are sequentially formed in the substrate. A rapid thermal annealing operation is carried out to initiate a re-crystallization of silicon in the amorphized region and activate the dopants within the extension region and the doped source/drain region to form a source/drain terminal. The annealing operation is carried out at a high temperature in a range of 800° C. to 900° C. Although the pre-amorphization implantation is able to lower the channel effect due to the dopants, the diffusion of dopants cannot be prevented.

Another conventional method of fabricating a MOS transistor involves the following steps. First, an amorphization implantation using germanium ions is carried out on a substrate with a gate structure thereon. Thereafter, an extension region and doped source/drain region are sequentially formed within the amorphized region of the substrate. A solid phase epitaxial fabrication process is carried out to re-crystallize the silicon in the amorphized region and activate the dopants within the extension region and the doped source/drain region to form a source/drain terminal. However, the resistance at the source/drain terminal is still relatively high and the saturated drain current is still relatively low for a MOS transistor fabricated using this method.

SUMMARY OF THE INVENTION

Accordingly, one object of the present invention is to provide a method of manufacturing a metal-oxide-semiconductor (MOS) transistor capable of reducing sheet resistance at the gate terminal of the transistor.

A second object of this invention is to provide a method of manufacturing a metal-oxide-semiconductor (MOS) transistor capable of reducing sheet resistance at the source/drain terminal of the transistor.

A third object of this invention is to provide a method of manufacturing a metal-oxide-semiconductor (MOS) transistor that has a relatively low thermal budget for preventing transient enhance diffusion and short channel effect.

To achieve these and other advantages and in accordance with the purpose of the invention, as embodied and broadly described herein, the invention provides a method of manufacturing a MOS transistor. First, a gate insulation layer and a conductive layer are sequentially formed over a substrate. Thereafter, a pre-amorphization implantation of the conductive layer is carried out so that the conductive layer is amorphized. In the pre-amorphization implantation, the doping ions have a radius greater than the germanium ions. Next, the conductive layer and the gate insulation layer are patterned to form a gate structure. A first spacer is formed on the sidewall of the gate structure and then a doped source/drain extension region is formed in the substrate on each side of the first spacer. A second spacer is formed on the sidewall of the first spacer and then a doped source/drain region is formed in the substrate on each side of the second spacer. A solid phase epitaxial process is carried out to re-crystallize the amorphized conductive layer within the gate structure and activate the doped source/drain extension region and the doped source/drain region to form a source/drain terminal.

This invention also provides a second method of manufacturing a MOS transistor. First, a substrate having a gate structure thereon is provided. Thereafter, a spacer is formed on the sidewall of the gate structure. A pre-amorphization implantation of the substrate is carried out so that a portion of the substrate is amorphized. In the pre-amorphization implantation, the doping ions have a radius greater than the germanium ions. A doped source/drain extension region is formed in the substrate on each side of the first spacer. A second spacer is formed on the sidewall of the first spacer and then a doped source/drain region is formed in the substrate on each side of the second spacer. A solid phase epitaxial process is carried out to re-crystallize the amorphized substrate and activate the doped source/drain extension region and the doped source/drain region to form a source/drain terminal.

This invention also provides a third method of manufacturing a MOS transistor. First, a gate insulation layer and a conductive layer are sequentially formed over a substrate. Thereafter, a first pre-amorphization implantation of the conductive layer is carried out so that the conductive layer is amorphized. In the first pre-amorphization implantation, the doping ions have a radius greater than the germanium ions. Next, the conductive layer and the gate insulation layer are patterned to form a gate structure. A first spacer is formed on the sidewall of the gate structure and then a second pre-amorphization implantation of the substrate is carried out so that a portion of the substrate is amorphized. In the second pre-amorphization implantation, the doping ions have a radius greater than the germanium ions. A doped source/drain extension region is formed in the substrate on each side of the first spacer. A second spacer is formed on the sidewall of the first spacer. Next, a doped source/drain region is formed in the substrate on each side of the second spacer. Thereafter, a solid phase epitaxial process is carried out to re-crystallize the amorphized conductive layer within the gate structure and the amorphized substrate and, at the same time, activate the doped source/drain extension region and the doped source/drain region to form a source/drain terminal.

In the aforementioned method of fabricating a MOS transistor, xenon, argon or krypton ions are used as the doping ions.

In this invention, a pre-amorphization implantation of the conductive layer is carried out before performing a gate doping operation. The pre-amorphization implantation produces an amorphized layer with a reduced energy barrier.

Consequently, in a subsequent gate doping operation, the dopants can improve conductivity and hence lower the sheet resistance of the gate structure.

Furthermore, the pre-amorphization implantation of the substrate is carried out using xenon, argon or krypton ions instead of the conventional germanium ions. Because the xenon, argon or krypton ion have an ion radius greater than the germanium ion, the crystal lattice of the substrate is more efficiently broken down to produce a lower energy barrier. Therefore, the dopants can provide the subsequently fabricated extension region and source/drain region with an improved conductivity and hence lower the sheet resistance of the source/drain terminal.

In addition, the MOS transistor of this invention uses a solid phase epitaxial process to activate the dopants within the source/drain region. Since the solid phase epitaxial process has a low thermal budget, transient enhance diffusion and short channel effect resulting from using a high-temperature annealing process can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
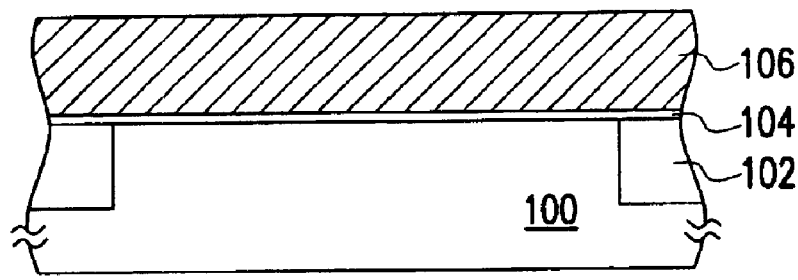
FIGS. 1A to 1F are schematic cross-sectional views showing the progression of steps for fabricating a metal-oxide-semiconductor transistor according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views showing the progression of steps for fabricating a metal-oxide-semiconductor transistor according to a first preferred embodiment of this invention. As shown in FIG. 1A, a substrate 100 such as a silicon substrate with a shallow trench isolation region 102 therein is provided. Thereafter, a gate insulating layer 104 and a conductive layer 106 are sequentially formed over the substrate 100. The conductive layer 106 has a thickness in a range of about 1200 Å to 1600 Å. The conductive layer is a polysilicon layer formed, for example, by performing a low-pressure chemical vapor deposition process at a deposition temperature of around 710° C.

Figure 1B:
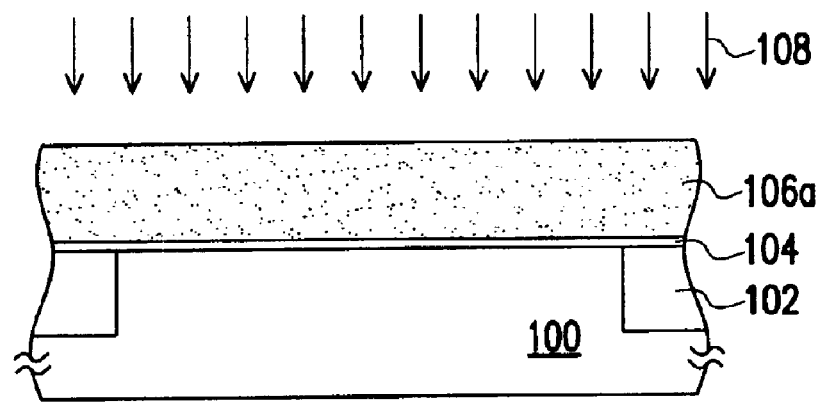

As shown in FIG. 1B, a pre-amorphization implantation 108 of the conductive layer 106 is carried out using a dopant having an ionic radius greater than the germanium ion, for example, a xenon, argon or krypton ion. The pre-amorphization implantation 108 is an ion implantation that implants dopants into the conductive layer 106 (a polysilicon layer) to form a conductive amorphous silicon layer 106a. The pre-amorphization implantation 108 is carried out by implanting dopants at a dosage level in a range of about $1*10^{14}$ atoms/cm$^2$ to $5*10^{14}$ atoms/cm$^2$ and at an implantation energy level in a range of about 25 KeV to 70 KeV.

Thereafter, an ion implantation is carried out to implant ions into the conductive layer 106a In the ion implantation, either P-type dopants or N-type dopants can be used. If N-type ions such as phosphorus are used in the implantation, an implantation dosage in a range of about $3*10^{15}$ atoms/cm$^2$ to $6*10^{15}$ atoms/cm$^2$ and an implantation energy level in a range of about 35 to 45 KeV can be used. On the other hand, if P-type ions are used, the ion implantation can be combined with a source/drain doping operation at a later stage.

Figure 1C:
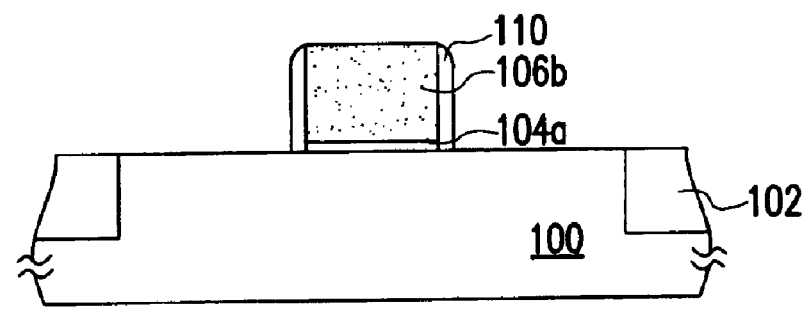

As shown in FIG. 1C, the conductive layer 106a and the gate insulation layer 104 are patterned to from a gate structure that comprises a gate 106b and a gate insulation layer 104a. The conductive layer 106a and the gate insulation layer 104 are patterned, for example, by forming a patterned photoresist layer (not shown) over the conductive layer 106a and performing an anisotropic dry etching process using the photoresist layer as an etching mask.

Thereafter, a first spacer 110 is formed on the sidewalls of the gate structure. The first spacer 110 is formed, for example, by depositing dielectric material over the substrate 100 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas.

Figure 1D:
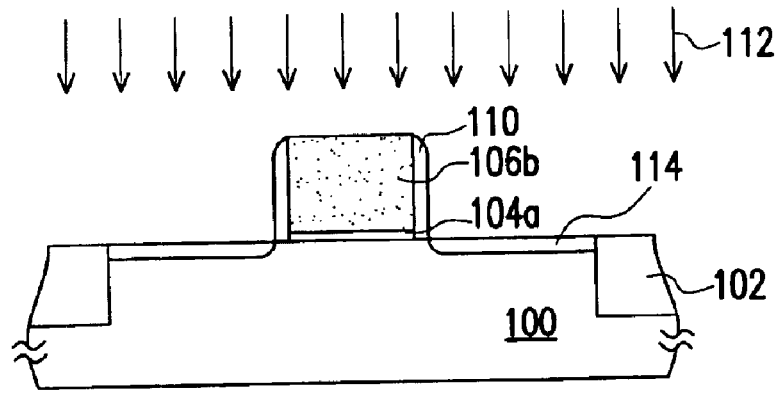

As shown in FIG. 1D, a doped source/drain extension region 114 is formed in the substrate 100 on each side of the first spacer 110. The doped source/drain extension region 114 is formed, for example, by performing an ion implantation process 112 using the gate structure and the first spacer as a mask. In the ion implantation 112, N-type or P-type ions can be used according to the desired state of the device. If N-type ions such as arsenic are used in the implantation, an implantation dosage in a range of about $5*10^{14}$ atoms/cm$^2$ to $2*10^{15}$ atoms/cm$^2$ and an implantation energy level in a range of about 3 to 5 KeV can be used. On the other hand, if P-type ions such as fluoroboride ions are used, an implantation dosage in a range of about $5*10^{14}$ atoms/cm$^2$ to $2*10^{15}$ atoms/cm$^2$ and an implantation energy level in a range of about 1 to 2 KeV can be used.

Figure 1E:
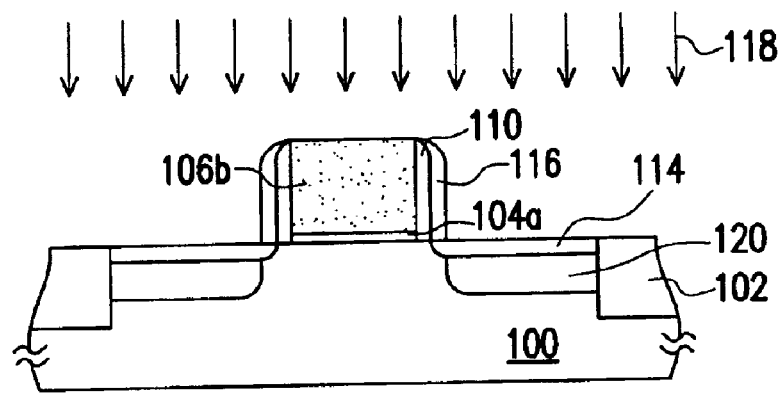

As shown in FIG. 1E, a second spacer 116 is formed on the sidewall of the first spacer 110. The second spacer 116 is formed, for example, by depositing dielectric material over the substrate 100 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas.

Furthermore, in another preferred embodiment, the second spacer 116 can be formed, for example, by forming a dielectric layer (not shown) on the substrate 100 by using BTBAS (Bis(tert-butylamino)silane) as a precursor and then etching back the dielectric layer in an anisotropic dry etching process. Wherein the pressure of the processing furnace can be maintained in a range of about 0.5~2.5 torr, the volume percentage of BTBAS gas compared to O$_2$ gas can be maintained in a range of about 10~30%, the volume percentage of BTBAS gas comapared to $NH_3$ gas can be maintained in a range of about 15~25%, the gas flow rate of BTBAS can be maintained in a range of about 75~110 sccm, and the gas flow rate of $NH_3$ can be maintained in a range of about 110~200 sccm.

It is to be noted that because the deposition temperature of forming second spacer 116 by using BTBAS as the precursor is maintained in a range of about 500° C.~650° C., which is near to the temperature of solid phase epitaxial process, therefore under this deposition temperature condition, the solid phase epitaxial process for the doped source/drain extension region 114 can also be carried out at the same time to activate the doped source/drain extension region 114, so that the sheet resistance of the source/drain extension region 212 can be greatly reduced.

Thereafter, a doped source/drain region 120 is formed in the substrate on each side of the second spacer 116. The doped source/drain region 120 is formed, for example, by performing an ion implantation process 118 using the gate structure, the first spacer and the second spacer as a mask. In the ion implantation 118, N-type or P-type ions can be used according to the desired state of the device. If N-type ions such as phosphorus ions are used in the implantation, an implantation dosage in a range of about $2*10^{13}$ atoms/$cm^2$ to $4*10^{13}$ atoms/$cm^2$ and an implantation energy level in a range of about 35 to 45 KeV can be used. If N-type ions such as arsenic ions are used in the implantation, an implantation dosage in a range of about $2*10^{15}$ atoms/$cm^2$ to $4*10^{15}$ atoms/$cm^2$ and an implantation energy level in a range of about 35 to 45 KeV can be used. On the other hand, if P-type ions such as boron ions are used, an implantation dosage in a range of about $7*10^{13}$ atoms/$cm^2$ to $4*10^{15}$ atoms/$cm^2$ and an implantation energy level in a range of about 5 to 12 KeV can be used. If P-type ions such as fluoroboride ions are used, an implantation dosage in a range of about $5*10^{14}$ atoms/$cm^2$ to $1*10^{15}$ atoms/$cm^2$ and an implantation energy level in a range of about 12 to 18 KeV can be used. Furthermore, if the gate 106b is also a P-doped region, the gate implantation and the source/drain implantation can be carried out together.

Figure 1F:
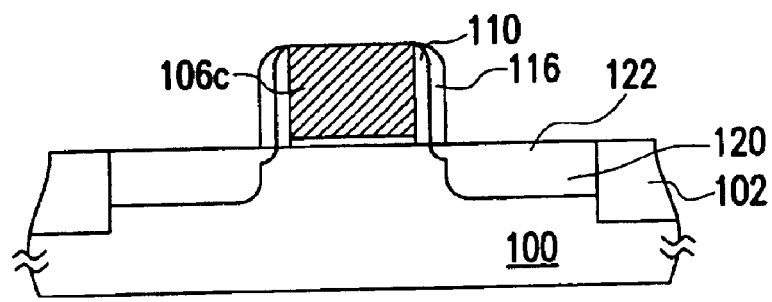

As shown in FIG. 1F, a solid phase epitaxial process is carried out to re-crystallize the amorphized gate 106b into a poly silicon conductive layer 106c and activate the doped source/drain extension region 114 and the doped source/drain region 120 to form the source/drain terminal 122. The solid phase epitaxial process is performed at a temperature range of about 550° C. to 600° C. for a period of about 30 to 90 minutes, for example.

In the aforementioned method of fabricating a MOS transistor, a pre-amorphization implantation of the conductive layer (the gate) is carried out before performing a gate doping operation. The pre-amorphization implantation produces an amorphized layer with a reduced energy barrier. Consequently, in a subsequent gate doping operation, the dopants can improve conductivity and hence lower the sheet resistance of the gate structure.

Figure 2A:
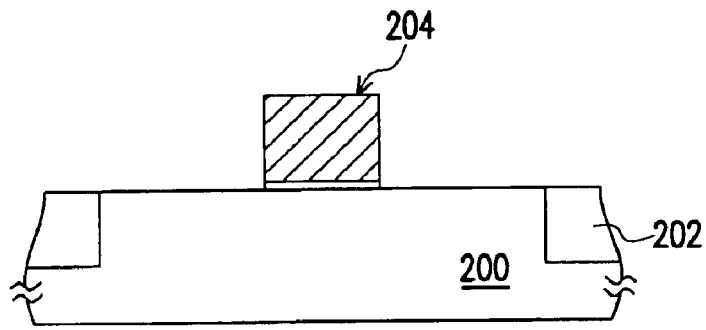
FIGS. 2A to 2E are schematic cross-sectional views showing the progression of steps for fabricating a metal-oxide-semiconductor transistor according to a second preferred embodiment of this invention.

FIGS. 2A to 2E are schematic cross-sectional views showing the progression of steps for fabricating a metal-oxide-semiconductor transistor according to a second preferred embodiment of this invention. As shown in FIG. 2A, a substrate 200 such as a silicon substrate with a shallow trench isolation region 202 therein is provided. Thereafter, a gate structure 204 comprising a gate insulation layer and a gate layer is formed over the substrate 200. A first spacer 205 is formed on the sidewalls of the gate structure 204. The first spacer 205 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas.

Figure 2B:
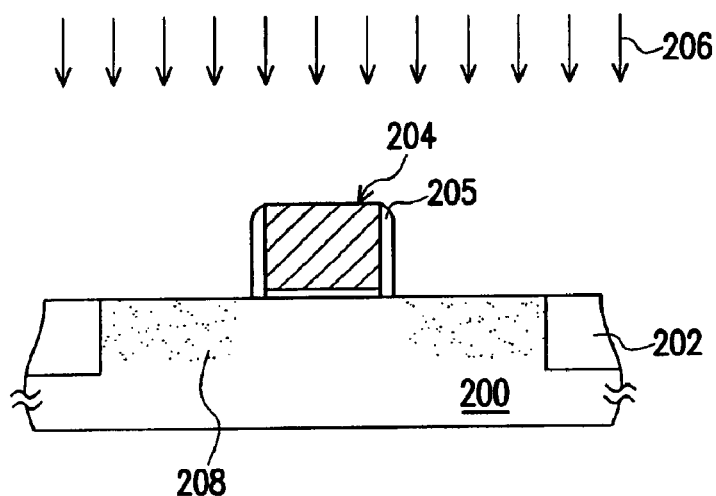

As shown in FIG. 2B, a pre-amorphization implantation 206 of the substrate 200 is carried out using a dopant having an ionic radius greater than the germanium ion, for example, xenon, argon or krypton ion. The pre-amorphization implantation 206 is an ion implantation that implants dopants into the substrate 200 to form an amorphized silicon region 208. The pre-amorphization implantation 206 is carried out by implanting dopants at a dosage level in a range of about $1*10^{14}$ atoms/$cm^2$ to $5*10^{14}$ atoms/$cm^2$ and at an implantation energy level in a range of about 25 KeV to 70 KeV.

Figure 2C:
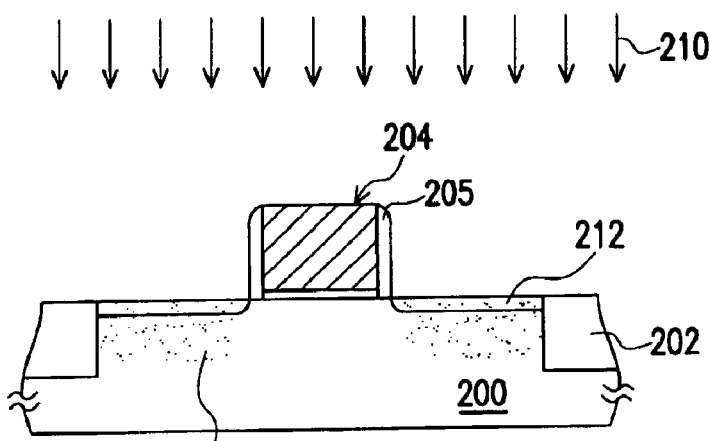

As shown in FIG. 2C, a doped source/drain extension region 212 is formed in the substrate 200 on each side of the first spacer 205 next to the gate structure 204. The doped source/drain extension region 212 is formed, for example, by performing an ion implantation process 210 using the gate structure 204 and the first spacer 205 as a mask. In the implantation 210, N-type or P-type ions can be used according to the desired state of the device. If N-type ions such as arsenic are used in the implantation, an implantation dosage in a range of about $5*10^{14}$ atoms/$cm^2$ to $2*10^{15}$ atoms/$cm^2$ and an implantation energy level in a range of about 3 to 5 KeV can be used. On the other hand, if P-type ions such as fluoroboride ions are used, an implantation dosage in a range of about $5*10^{14}$ atoms/$cm^2$ to $2*10^{15}$ atoms/$cm^2$ and an implantation energy level in a range of about 1 to 2 KeV can be used.

Figure 2D:
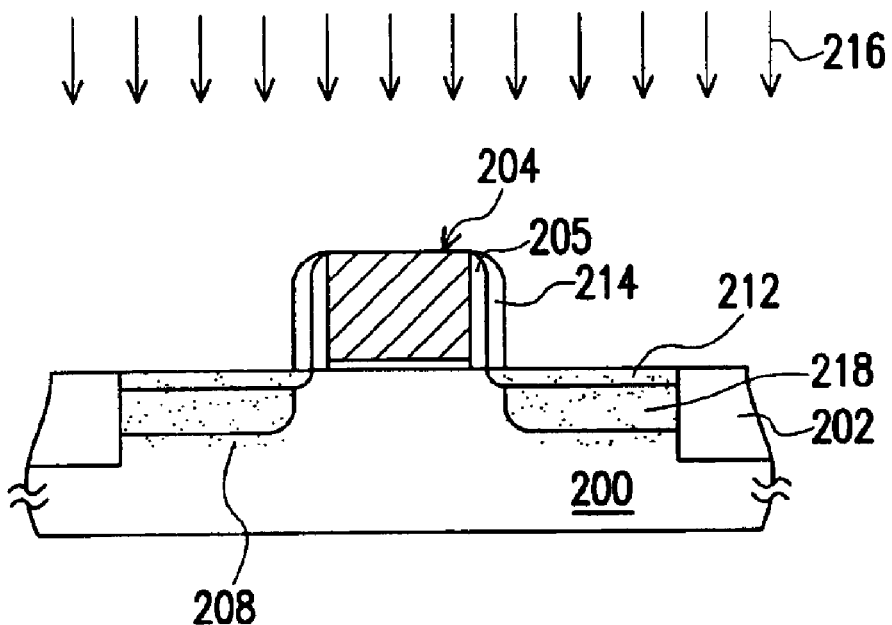

As shown in FIG. 2D, a second spacer 214 is formed on the sidewall of the first spacer 205. The second spacer 214 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas. Alternatively, the second spacer 214 is formed, for example, by performing a rapid thermal annealing process or heating inside a furnace at a temperature exceeding 700° C. Thereafter, xenon, argon or krypton ions are implanted into the substrate 200 to break up any re-crystallized silicon in the amorphized region 208 during the annealing operation.

Furthermore, in another preferred embodiment, the second spacer 214 can be formed, for example, by forming a dielectric layer (not shown) on the substrate 200 by using BTBAS (Bis(tert-butylamino)silane) as a precursor and then etching back the dielectric layer in an anisotropic dry etching process. Wherein the pressure of the processing furnace can be maintained in a range of about 0.5~2.5 torr, the volume percentage BTBAS gas compared to $O_2$ gas can be maintained in a range of about 10~30%, the volume percentage of BTBAS gas compared to $NH_3$ gas can be maintained in a range of about 15~25%, the gas flow rate of BTBAS can be maintained in a range of about 75~110 sccm, and the gas flow rate of $NH_3$ can be maintained in range of about 110~200 sccm.

It is to be note that because the deposition temperature of forming second spacer 214 by using BTBAS as the precursor is maintained in a range of about 500° C.~650° C., which is close to the temperature of solid phase epitaxial process, therefore under this deposition temperature, the solid phase epitaxial process for the doped source/drain extension region 212 can also be carried out at the same time to activate the doped source/drain extension region 212, so that the sheet resistance of the source/drain extension region 212 can be greatly reduced.

Thereafter, a doped source/drain region 218 is formed in the substrate 200 on each side of the second spacer 214. The doped source/drain region 218 is formed, for example, by performing an ion implantation process 216 using the gate structure 204 and the second spacer 214 as a mask. In the ion implantation 216, N-type or P-type ions can be used according to desired state of the device. If N-type ions such as phosphorus ions are used in the implantation, an implantation dosage in a range of about $2*10^{13}$ atoms/cm$^2$ to $4*10^{13}$ atoms/cm$^2$ and an implantation energy level in a range of 35 to 45 KeV can be used. If N-type ions such as arsenic ions are used in the implantation, an implantation dosage in a range of about $2*10^{15}$ atoms/cm$^2$ to $4*10^{15}$ atoms/cm$^2$ and an implantation energy level in a range of about 35 to 45 KeV can be used. On the other hand, if P-type ions such as boron ions are used, an implantation dosage in a range of about $7*10^{13}$ atoms/cm$^2$ to $4*10^{15}$ atoms/cm$^2$ and an implantation energy level in a range of about 5 to 12 KeV can be used. If P-type ions such as fluoroboride ions are used, an implantation dosage in a range of about $5*10^{15}$ atoms/cm$^2$ to $1*10^{15}$ atoms/cm$^2$ and an implantation energy level in a range of about 12 to 18 KeV can be used.

Figure 2E:
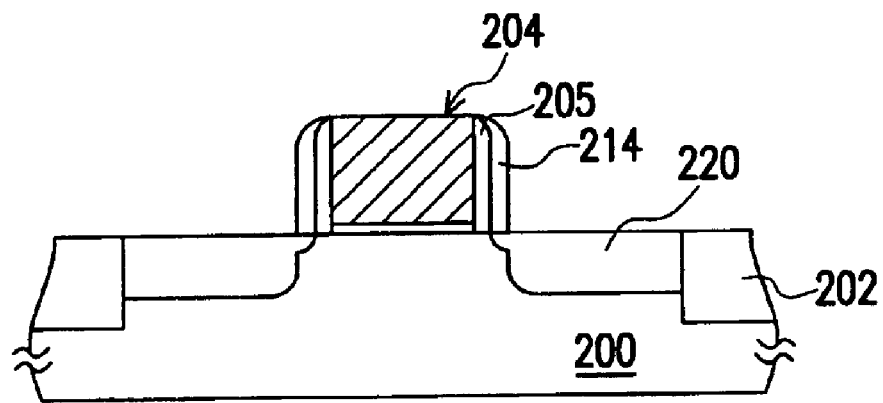

As shown in FIG. 2E, a solid phase epitaxial process is carried out to recrystallize the amorphized region 208 in the substrate 200 into a polysilicon layer and activate the doped source/drain extension region 212 and the doped source/drain region 218 to form the source/drain terminal 220. The solid phase epitaxial process is performed at a temperature in a range of about 550° C. to 600° C. for a period of about 30 to 90 minutes, for example.

In the aforementioned method of fabricating a MOS transistor, the pre-amorphization implantation of the substrate is carried out using xenon, argon or krypton ions instead of the conventional germanium ions. Because the xenon, argon or krypton ion have an ion radius greater than the germanium ion, the crystal lattice of the substrate is more efficiently broken down to produce a lower energy barrier. Therefore, the dopants can provide the subsequently fabricated extension region and source/drain region with an improved conductivity and hence lower the sheet resistance of the source/drain terminal.

The two aforementioned embodiments of this invention can also be combined to produce yet another embodiment. For example, the steps depicted in FIGS. 1A to 1C are carried out to form the gate insulation layer and the conductive layer (a gate) over the substrate, implant xenon, argon or krypton ions to amorphize the conductive layer, pattern the conductive layer and the gate layer to form the gate and form the first spacer on the sidewall of the gate and the gate insulation layer. Thereafter, the steps depicted in FIGS. 2B to 2E are carried out to implant xenon, argon or krypton ions into the substrate to amorphize the substrate, to form the doped source/drain extension region, the second spacer and the doped source/drain region sequentially and finally perform the solid phase epitaxial process to re-crystallize the amorphized gate and a portion of the substrate into polysilicon layers and activate the doped source/drain extension region and the doped source/drain region to form a source/drain terminal with an associated extension region.

The process of manufacturing the MOS transistor according to this invention uses a pre-amorphization implantation by implanting xenon, argon or krypton ions into the conductive layer for forming the gate and the substrate. Hence, the gate as well as the source/drain terminal of the ultimately formed MOS transistor has a rather low sheet resistance.

Furthermore, in the aforementioned embodiments, both the first spacer and the second spacer have a singular layer structure. However, depending on the actual processing requirement and design need (for example, a P-type field effect transistor), the first spacer or the second spacer can have a double-layered structure.

Obviously, the aforementioned methods for producing a MOS transistor can be applied to manufacture other semiconductor transistor device with a reduced electrical resistance.

In conclusion, this invention includes at least the following advantages:

1. The pre-amorphization implantation of the conductive layer is carried out before performing a gate doping operation. The pre-amorphization implantation produces an amorphized layer with a reduced energy barrier. Consequently, in a subsequent gate doping operation, the dopants can improve conductivity and hence lower the sheet resistance of the gate structure.

2. The pre-amorphization implantation of the substrate is carried out using xenon, argon or krypton ions instead of the conventional germanium ions. Because the xenon, argon or krypton ion have an ion radius greater than the germanium ion, the crystal lattice of the substrate is more efficiently broken down to produce a lower energy barrier. Therefore, the dopants can provide the subsequently fabricated extension region and source/drain region with an improved conductivity and hence lower the sheet resistance of the source/drain terminal.

3. The MOS transistor of this invention uses a solid phase epitaxial process to activate the dopants within the source/drain region. Since the solid phase epitaxial process has a low thermal budget, transient enhance diffusion and short channel effect resulting from using a high-temperature annealing process can be prevented.

4. The second spacer can be formed by using BTBAS as the precursor, and its deposition temperature is near to the temperature of solid phase epitaxial process, and therefore the solid phase epitaxial process for the doped source/drain extension region can be carried out at the same time to activate the doped source/drain extension region, so that the sheet resistance of the formed source/drain extension region can be greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal-oxide-semiconductor (MOS) transistor, comprising the steps of:

providing a substrate;

forming a gate insulation layer and a conductive layer over the substrate sequentially;

performing a pre-amorphization implantation on the conductive layer so that the conductive layer is amorphized;

patterning the conductive layer and the gate insulation layer to form a gate structure;

forming a first spacer on the sidewalls of the gate structure;

forming a doped source/drain extension region in the substrate aside each side of the first spacer;

forming a second spacer on the sidewall of the first spacer, meanwhile, performing a solid phase epitaxial process to re-crystallize the amorphized conductive layer in the gate structure and activating a plurality of first dopants in the doped source/drain extension region; and forming a doped source/drain region in the substrate on each side of the second spacer.

2. The method of claim 1, wherein a deposition temperature of a dielectric layer for forming the second spacer is in a range of 500° C.~650° C.

3. The method of claim 2, wherein the method for forming the second spacer comprise using a BTBAS (Bis(tert-butylamino)silane) as a precursor to carry out the deposition of the dielectric layer for forming the second spacer.

4. The method of claim 1, wherein after the step of performing the pre-amorphization implantation, furthermore includes performing an ion implantation process to converts the conductive layer into an N-type or P-type conductive layer.

5. The method of claim 1, wherein the pre-amorphization implantation is carried out by using a plurality of second dopants having an ionic greater than a germanium ion.

6. A method of manufacturing a metal-semiconductor (MOS) transistor, comprising the steps of:

providing a substrate having a gate structure thereon;

forming a first spacer on the sidewalls of the gate structure;

performing a pre-amorphization implantation to amorphize a portion of the substrate;

forming a doped source/drain extension region in the substrate aside each side of the first spacer;

forming a second spacer on the sidewall of the first spacer, meanwhile, performing a solid phase exitaxial process to re-crystallize the amorphized portion of the substrate and activating the doped source/drain extension region; and forming a doped source/drain region in the substrate on each side of the second spacer.

7. The method of claim 6, wherein a deposition temperature of a dielectric layer for forming the second spacer is in a range of 500° C.~650° C.

8. The method of claim 7, wherein the method for forming the second spacer comprise using a BTBAS (Bis(tert-butylamino)silane) as a precursor to carry out the deposition of the dielectric layer for forming the second spacer.

9. The method of claim 6, wherein the pre-amorphization implantation is carried out by using a plurality of first dopants having an ionic radius greater than a germination ion.

10. The method of claim 9, wherein the first dopants comprise xenon, argon or krypton ions.

11. The method of claim 10, wherein the pre-amorphization implantation is carried out using the first dopants set to a dosage level in a range of $1*10^{14}$ to $5*10^{14}$ atoms/cm$^2$.

12. The method of claim 10, wherein the pre-amorphization implantation is carried out using the first dopants accelerated to an energy level in a range of 25 to 70 KeV.

13. A method of manufacturing a metal-oxide-semiconductor (MOS) transistor, comprising the steps of:

providing a substrate having a gate structure formed thereon, wherein the gate structure includes a gate insulating layer formed on the substrate, an amorphized gate formed on the gate insulating layer and a first pacer formed on a sidewall constructed by the gate insulating layer and the amorphized gate, and a portion of the substrate uncovered by the gate structure has been amorphized;

forming a doped source/drain extension region in the source substrate aside each side of the first spacer;

forming a second spacer on the sidewall of the first spacer, meanwhile, performing a solid phase epitaxial process to re-crystallize the amorphized portion of the substrate and activating a plurality of first dopants in the doped source/drain extension region; and forming a doped source/drain region in the substrate on each side of the second spacer.

14. The method of claim 13, wherein a deposition temperature of a dielectric layer for forming the second spacer is in a range of 500° C.~650°.

15. The method of claim 14, wherein the method for forming the second spacer comprise using a BTBAS (Bis(tert-butylamino)silane) as a precursor to carry out the deposition of the dielectric layer for forming the second spacer.

16. The method of claim 5, wherein the second dopants comprise xenon, argon or krypton ions.

17. The method of claim 5, wherein the pre-amorphization implantation is carried out using the second dopants set to a dosage level in a range of $1*10^{14}$ to $5*10^{14}$ atoms/cm$^2$.

18. The method of claim 5, wherein the pre-amorphization implantation is carried out using the second dopants accelerated to an energy level in a range of 25 to 70 KeV.

* * * * *